United States Patent [19]
Artieri

[11] Patent Number: 5,881,010
[45] Date of Patent: Mar. 9, 1999

[54] MULTIPLE TRANSISTOR DYNAMIC RANDOM ACCESS MEMORY ARRAY ARCHITECTURE WITH SIMULTANEOUS REFRESH OF MULTIPLE MEMORY CELLS DURING A READ OPERATION

[75] Inventor: Alain Artieri, Los Altos, Calif.

[73] Assignee: STMicroelectronics, Inc., Carrollton, Tex.

[21] Appl. No.: 856,972

[22] Filed: May 15, 1997

[51] Int. Cl.$^6$ .............. G11C 7/00; G11C 11/00; G11C 16/04

[52] U.S. Cl. .............. 365/222; 365/154; 365/156; 365/189.08; 365/203

[58] Field of Search ............. 365/154, 156, 365/189.08, 222, 203

[56] References Cited

U.S. PATENT DOCUMENTS

| | | | |
|---|---|---|---|
| 3,893,087 | 7/1975 | Baker | 365/154 |
| 5,020,028 | 5/1991 | Wanlass | 365/154 |
| 5,446,689 | 8/1995 | Yasui et al. | 365/154 |
| 5,706,226 | 1/1998 | Chan et al. | 365/154 |

*Primary Examiner*—David Nelms
*Assistant Examiner*—Trong Phan
*Attorney, Agent, or Firm*—Theodore E. Galanthay; Lisa K. Jorgenson

[57] ABSTRACT

A four transistor dynamic memory cell architecture and refresh technique which allows for cell refresh to occur during a read operation. The access and memory transistors of the individual memory cells are fabricated with a relative width-to-length ratio such that it is sufficient to merely activate the associated word line to perform the refresh operation. This is accomplished without activating the read sense amplifier resulting in lower power consumption and the retention of most recently read data. Multiple word lines may be activated concurrently utilizing the technique disclosed to further reduce the refresh rate overhead in a memory array and increase the overall memory array bandwidth.

30 Claims, 5 Drawing Sheets

MULTIPLE TRANSISTOR DYNAMIC RANDOM ACCESS MEMORY ARRAY ARCHITECTURE WITH SIMULTANEOUS REFRESH OF MULTIPLE MEMORY CELLS DURING A READ OPERATION

BACKGROUND OF THE INVENTION

The present invention relates, in general, to the field of integrated circuit ("IC") memory devices. More particularly, the present invention relates to a memory cell array architecture and simultaneous multiple cell refresh technique of especial utility in conjunction with integrated circuit "system on-chip" designs requiring intermediate size memory arrays.

Dynamic random access memory ("DRAM") devices are designed utilizing a volatile, dynamic memory cell architecture, with each cell comprising a single transistor and capacitor. They are "volatile" in the sense that upon powerdown, the memory contents are lost and "dynamic" in the sense that they must be constantly refreshed to maintain the charge in the cell capacitor. The refresh operation is accomplished when the memory contents of a row of cells in the memory array are read by the sense amplifiers and the logic states in the cells that have been read are amplified and written back to the cells. DRAM are used primarily for memory reads and writes and are relatively inexpensive to produce in terms of die area. It does, however, provide relatively slow access times.

On the other hand, static random access memory ("SRAM") devices are designed utilizing a volatile static memory cell architecture. They are considered to be "static" in that the contents of the memory cells need not be refreshed and the memory contents may be maintained indefinitely as long as power is supplied to the device. The individual memory cells of an SRAM comprise a simple, bi-stable transistor-based latch, using four or six transistors, that is either set or reset depending on the state of the data that was written to it. SRAMs provide much faster read and write access time than DRAM and are generally used as a memory cache. However, because the individual memory cell size is significantly larger, they are much more expensive to produce in terms of on-chip die area than DRAMs and they also generate more heat. Typical devices cost three to four times that of DRAMs.

Pseudo SRAMs ("PSRAMs") have, like DRAMs volatile, dynamic memory architecture that utilizes a similar single transistor/single capacitor memory cell architecture, and must be periodically refreshed. However, the primary difference is that it incorporates on-chip refresh timing and control logic to simplify and minimize external logic. They are designed to be pin-for-pin compatible with SRAM devices but are not a direct "drop-in" replacement due to the fact that the memory must be periodically refreshed.

Typical integrated "system on chip" circuits require relatively large embedded memories. For relatively small memory size requirements, SRAMs are generally used since the penalty in die area per bit to be stored is relatively minor. On the other hand, for large memory requirements, DRAM arrays are generally used due to their use of the smaller size, single transistor/single capacitor memory cell. However, the design of an embedded memory is more complex than that of SRAMs and may require a number of undesired, DRAM specific process steps in fabricating the overall integrated circuit "system on chip".

For intermediate size memory requirements, a four transistor ("4T") per bit DRAM cell may be used. Although sometimes referred to as pseudo SRAM, or pseudo DRAM, they are, nevertheless, dynamic, and the advantage of such a cell is that the layout and design (and hence, processing) is as simple and straightforward as that of a four transistor SRAM cell. Moreover, they can be made with a much smaller feature size. A significant drawback to conventional 4T designs is the frequency with which they must be periodically refreshed, and that rate becomes ever higher as the device geometry is decreased to further increase IC integration. The refresh rate for such a memory cell design can then become a significant input/output ("I/O") "bottleneck", especially when the memory bandwidth requirements are high. As a consequence, a need exists for an intermediate size memory architecture with a reduced refresh rate requirement.

SUMMARY OF THE INVENTION

Disclosed herein is a four transistor dynamic memory cell design and refresh technique in which the memory cells are refreshed while performing a "read" operation. The access and memory transistors of the individual memory cells are ratioed in such a way that activation of the associated word line is sufficient to immediately refresh the memory cell information. This is accomplished without activating the read sense amplifier and the most recently read data is maintained. As a consequence, the refresh operation does not require the activation of the read amplifier resulting in a much lowered IC power requirement. In fact, more than one memory cell word lines may be activated simultaneously so that, in a single cycle, many refresh operations may be performed in parallel. Conceptually, the entire memory array may be refreshed in a single cycle.

However, in order to ensure proper memory operation, the bit line precharge must be maintained during the refresh operation (in order that the bit lines do not become discharged) as this would corrupt the data in the memory cells by essentially writing in opposite values. Moreover, since the peak current demand can be relatively high if too many memory words were refreshed concurrently, a compromise must be achieved between acceptable peak current and the memory cell refresh period. As an example, if a 512 row memory array is operating at 50 MHz, it will generally need to be refreshed about every 20 $\mu$s. Using prior art approaches, this would require 10 $\mu$s, or 50% of the total memory bandwidth, just to perform the refresh operation. Utilizing the architecture and method of the present invention, the refresh overhead may be reduced as follows:

| Number of simultaneous rows refreshed | % of bandwidth for refresh operation |
| --- | --- |
| 2 | 25% |
| 4 | 12.5% |
| 8 | 6% |
| 16 | 3% |
| ... | ... |
| 512 | 0.001% |

As disclosed hereinafter, the simultaneous refresh of 16 rows is generally an acceptable compromise, being about 1/32 of the total number of rows in the memory array.

Particularly disclosed herein is an integrated circuit including a memory array comprising a plurality of memory cells and a sense amplifier coupled between first and second complementary bit lines. Each of the memory cells comprise first and second memory transistors operable for coupling first and second memory cell nodes to a first voltage line. The first and second memory transistors each have a gate terminal thereof coupled to the second and first memory cell nodes respectively. First and second access transistors are operable for coupling the first and second memory cell nodes to the first and second complementary bit lines. The first and second access transistors each have a gate terminal thereof coupled to an associated word line. The first and second memory transistors are fabricated with a predetermined width-to-length ratio greater than that of the first and second access transistors such that when the associated word line is activated the memory contents of the memory cell is refreshed.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein.

DESCRIPTION OF A PREFERRED EMBODIMENT

Figure 1:
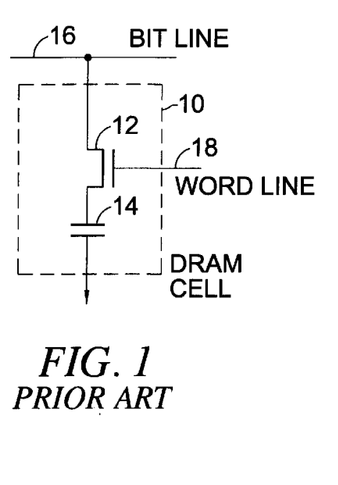
FIG. 1 is a schematic illustration of an individual conventional DRAM single transistor/single capacitor ("1T/1C") memory cell, illustrating its coupling to an adjacent bit and word lines.

With reference now to FIG. 1, a prior art DRAM memory cell 10 is shown. The DRAM memory cell 10 comprises an access transistor 12 coupled in series with a capacitor 14 between an associated bit line (or bit\ line) 16 and a voltage line $V_{ss}$ (or circuit ground). The capacitor 14 holds a charge (or absence of a charge) representative of one of two opposite logic states that is read out by activating the transistor 12 by applying an appropriate signal on the word line 18, thus either adding charge to, or removing charge from, the bit line 16. A sense amplifier (not shown) is coupled between the bit (and bit\) line 16.

Because the charge in the capacitor 14 tends to bleed off over time, it must be periodically recharged, or refreshed. Refresh is accomplished when the memory contents of a row of memory cells 10 are read by the associated sense amplifiers, and the logic states that were read are amplified and then written back to the memory cells 10. The memory cell 10 is also utilized in PSRAMs, the primary difference between this memory type and DRAMs being that the refresh timing and control logic is integrated on-chip with the memory array to simplify and minimize external logic.

Figure 2A:
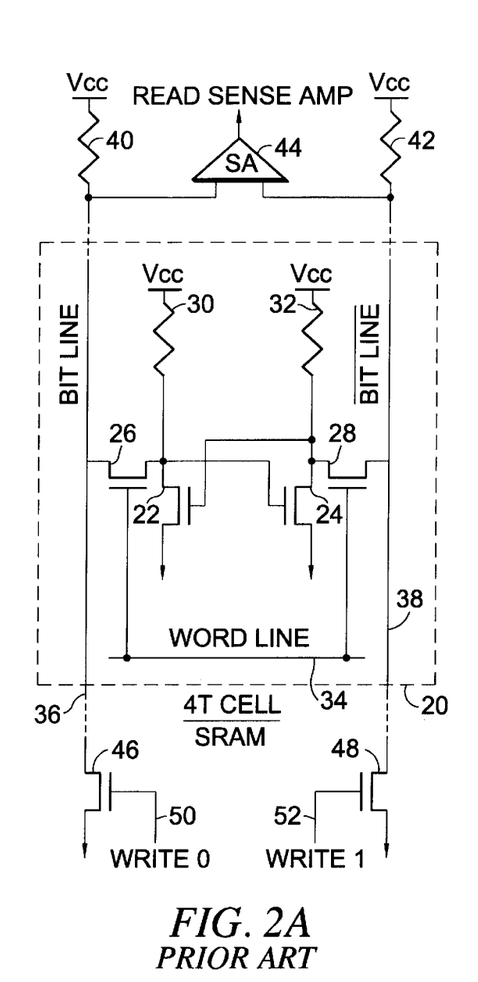
FIGS. 2A and 2B are, respectively, schematic illustrations of individual conventional four transistor ("4T") and six transistor ("6T") SRAM memory cells useful in understanding the principles of the present invention.

With reference additionally now to FIG. 2A, a prior art 4T SRAM memory cell 20 is shown. The memory cell 20 comprises, in pertinent part, a pair of cross-coupled transistors 22 and 24 forming a bistable latch for storing data. The gate of each of the transistors 22, 24 is coupled back to the drain of the opposite transistor. The drain terminals of transistors 22 and 24 are also coupled to bit line 36 and bit\ line 38 through access transistors 26 and 28 respectively as well as to a supply voltage ($V_{CC}$) through respective pull-up resistors 30, 32. Word line 34 is common coupled to the gates of the access transistors 26 and 28. Bit line 36 and the complementary bit\ line 38 are coupled to $V_{CC}$ through respective resistors 40, 42. A sense amplifier 44 is coupled across the bit line 36 and bit\ line 38 which are, respectively, coupled to circuit ground ($V_{SS}$) through transistors 46 and 48 respectively. The gates of transistors 46 and 48 receive "write 0" and "write 1" signals on lines 50 and 52, respectively.

Figure 2B:
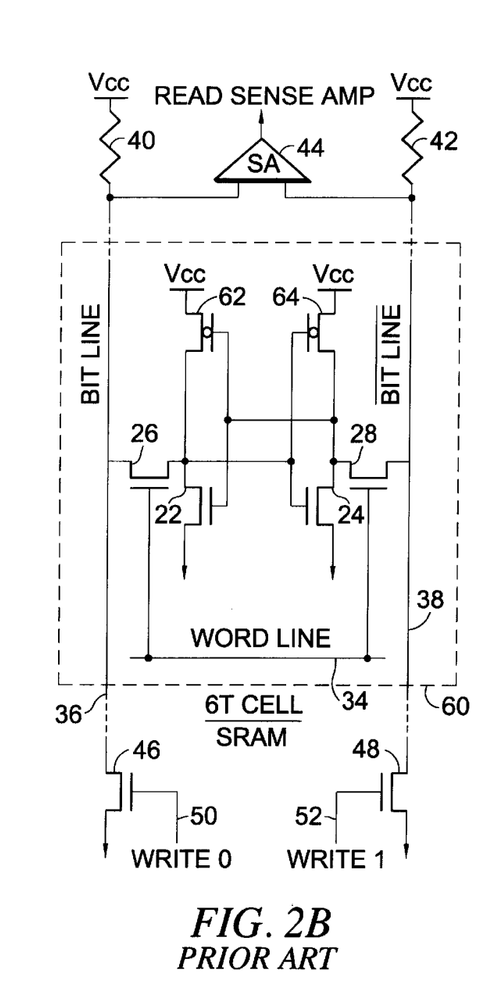

With reference additionally now to FIG. 2B, a prior six transistor ("6T") SRAM memory cell 60 is shown. With respect to the embodiment illustrated in this figure, like structure to that previously described with respect to FIG. 2A is like numbered and the foregoing description thereof shall suffice herefor. As is apparent, the 6T memory cell 60 is similar in all respects to the 4T memory cell 20 of FIG. 2A except for the replacement of resistors 30 and 32 with a pair of P-channel transistors 62, 64. The transistors 62 and 64 have their source terminals coupled to $V_{CC}$ and their respective drain terminals coupled to the drain terminals of transistors 22 and 24. The gate of transistor 62 is coupled to the drain terminal of transistor 24 and the gate of transistor 22, and the gate of transistor 64 is coupled to the drain terminal of transistor 22 and the gate of transistor 24.

Figure 3:
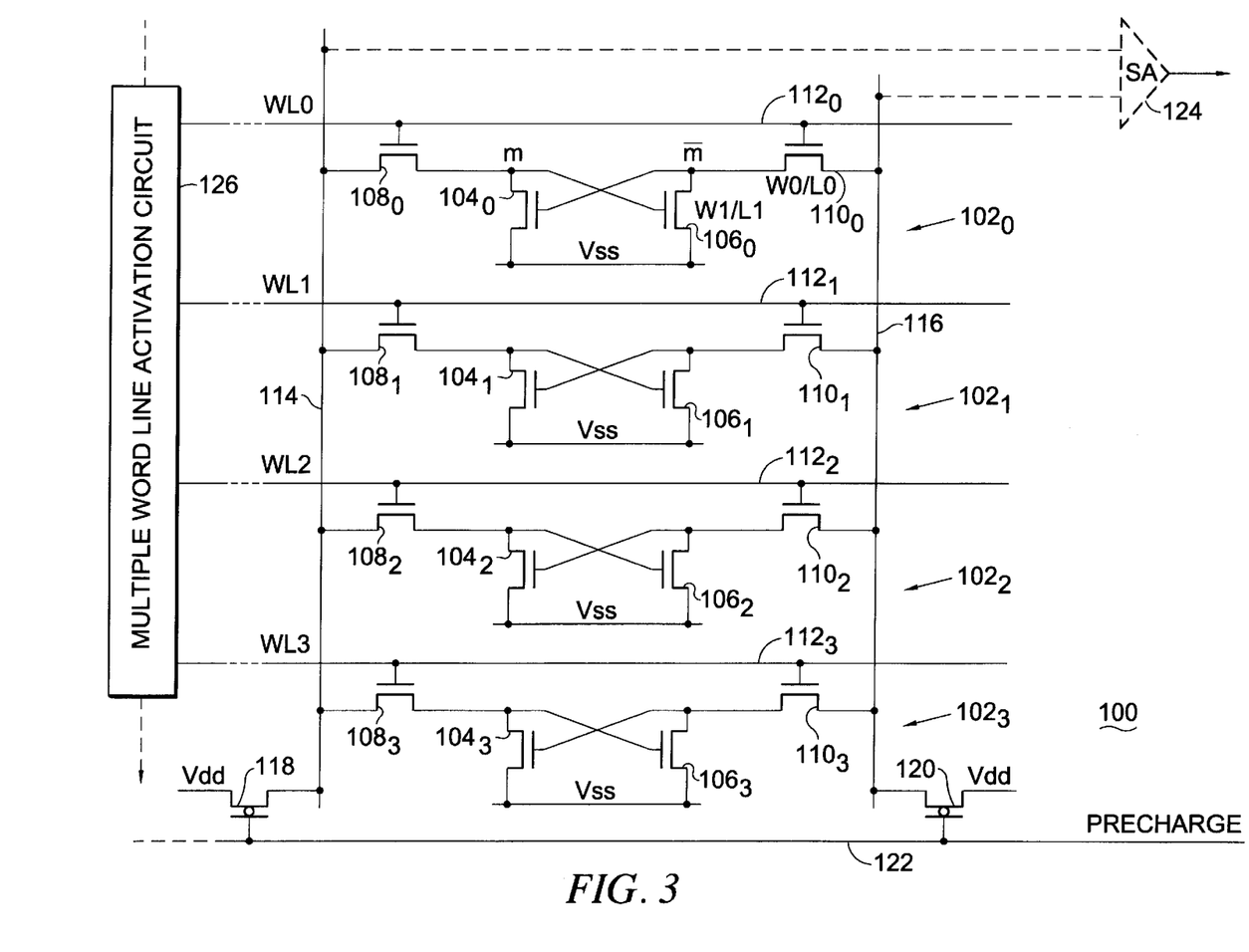
FIG. 3 is a schematic illustration of a four memory cell portion of a dynamic memory with fast refresh in accordance with the present invention illustrating the relative width-to-length ratio of a representative access transistor ("W0/L0") to that of a corresponding memory transistor ("W1/L1") and the complementary bit line precharge inputs.

With reference now to FIG. 3, a number of dynamic memory cells 100 incorporating a fast refresh function in accordance with the present invention is shown. The dynamic memory cells 100 illustrated are each similar structurally to the individual 4T memory cell 20 of FIG. 2A but are significantly different functionally, performing as a dynamic RAM cell instead of a static RAM cell as will be more fully described hereinafter.

The dynamic memory cells 100 comprise, in the portion of a memory array illustrated, a number of individual dynamic memory cells $102_0$ through $102_3$. The structure and function of each of the dynamic memory cells $102_0$ through $102_3$ will be described hereinafter with respect to dynamic memory cell $102_0$, however, the description thereof shall likewise suffice for that of dynamic memory cells $102_1$ through $102_3$ as well.

The dynamic memory cell $102_0$ incorporates a pair of cross coupled n-channel MOS transistors $104_0$ and $106_0$, each having its source terminal coupled to circuit ground ($V_{SS}$). The drain terminal (comprising a first memory cell node) of transistor $104_0$ is coupled to bit line 114 through n-channel access transistor $108_0$, and the drain terminal of transistor $106_0$ (comprising a second memory cell node) is coupled to bit\ line 116 through n-channel access transistor $110_0$. The gate of transistor $104_0$ is coupled back to the drain of transistor $106_0$ which, in turn, has its gate terminal coupled back to the drain of transistor $104_0$.

The gates of access transistors $108_0$ and $110_0$ are common connected to a word line $112_0$ ("WL0") as shown. Bit line 114 is coupled to a supply voltage source ($V_{DD}$) through p-channel transistor 118 and bit\ line 116 is coupled to $V_{DD}$ through p-channel transistor 120. The transistors 118 and 120 are enabled by a precharge signal applied to their common connected gates on line 122 as will be more fully described hereinafter. A sense amplifier 124 (shown in phantom) may be coupled across the bit line 114 and bit\ line 116 substantially as shown.

A refresh operation of the dynamic memory cells 100 is performed by enabling the gates of access transistors $108_0$ and $111_0$ by activating the word line $112_0$ as shown most clearly in the following FIG. 4. Ideally, this operation is undertaken while simultaneously maintaining a precharge on the bit line 114 and bit\ line 116 by enabling precharge transistors 118 and 120 by activating line 122 thereby coupling the bit line 114 and bit\ line 116 to $V_{DD}$ simultaneously. It should be noted that the foregoing is only necessary in the case of a multi-row refresh operation. In the prior art, only one row is refreshed at a time and, in the case of a single row refresh, it is not preferred as this would increase power comsumption. The data contents of the individual dynamic memory cells $102_0$ through $102_3$ are not corrupted by this operation if the proper resistive ratio has been established with respect to the access transistors $108_0$, $110_0$ and memory transistors $104_0$, $106_0$. The width-to-length ratios ("W/L") of transistors $108_0$ and $110_0$ ("W0/L0") is, in the exemplary implementation shown, approximately 1.8/0.6 microns and that of transistors $104_0$ and $106_0$ ("W1/L1") approximately 5.7/0.6 microns. A typically acceptable ratio is substantially in the range of (W1/L1)/(W0/L0)=3. For purposes of the FIG. 3, the drains of transistors $104_0$ and $106_0$ are labeled m and m\ respectively. Utilizing a multiple word line activation circuit 126 coupled to the various memory array word lines (e.g. $112_0$ through $112_3$ in the exemplary implementation shown), two or more of the rows of memory cells 102 may be concurrently refreshed as previously described. In this case, it is necessary to maintain precharge.

Figure 4:
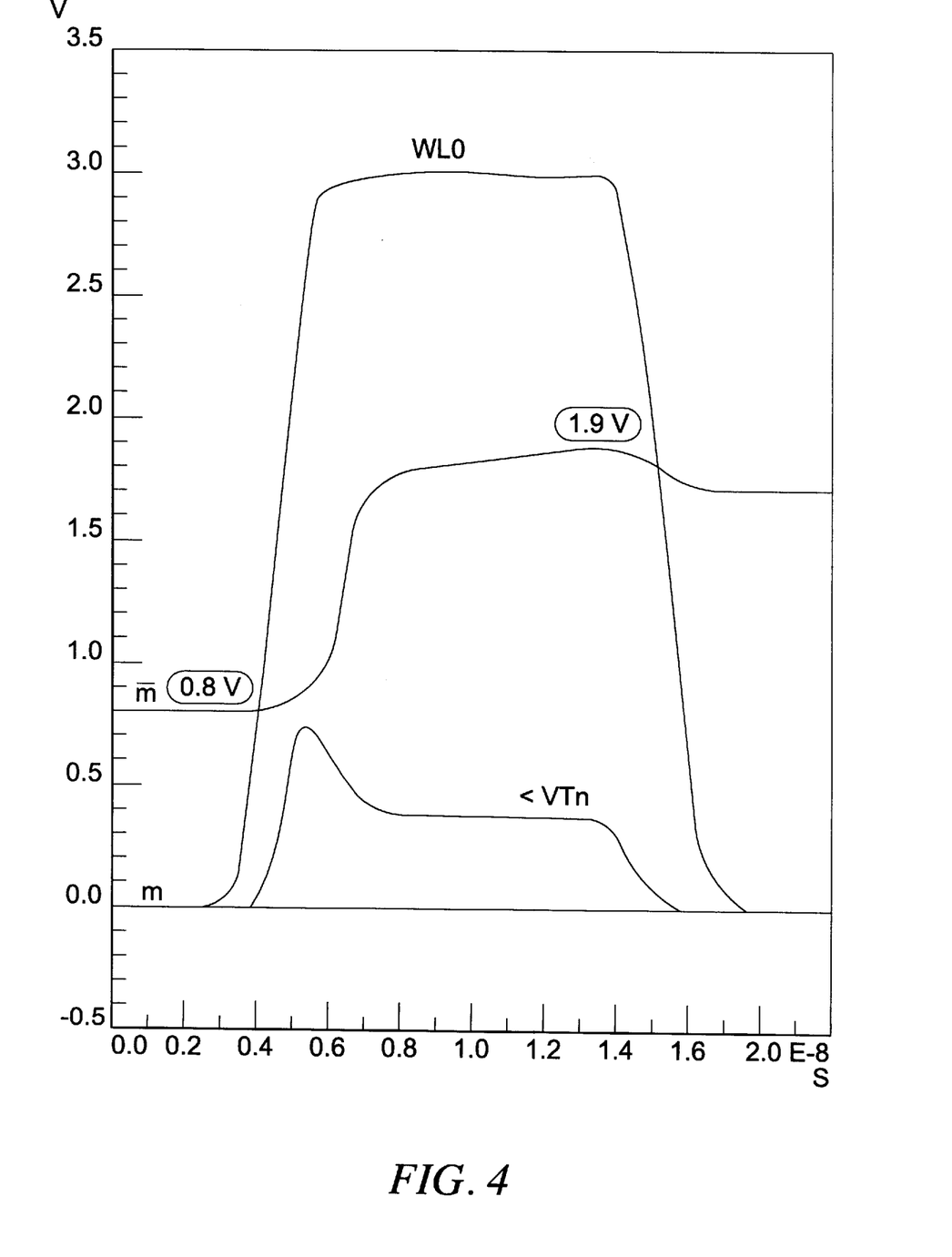
FIG. 4 is a graphic representation of the voltage levels on the lines "m" and "m\" of the preceding FIG. 3 associated with the first word line ("WL0")

With reference additionally now to FIG. 4, the voltages on lines m (drain of transistor $104_0$) and m\ (drain of transistor $106_0$), when ratioed with respect to transistors $108_0$ and $110_0$ as previously described, are shown as wordline $112_0$ (WL0) is transitioned from 0 to 3.0 volts and then back to 0 volts. Line m\ rises from a level of substantially 0.8 volts to a level of 1.9 volts before dropping off slightly to 1.8 volts as the voltage on WL0 is decreased again to 0 volts. In turn, the voltage on line m\ rises to a peak of about 0.7 volts as WL0 begins its transition to 3.0 volts falling back then to about 0.4 volts (less than a threshold voltage $V_T$) until again returning to 0 volts as WL0 transitions back to 0 volts. Thus, the memory cell $102_0$ has been refreshed merely by enabling the associated word line $112_0$.

Figure 5:
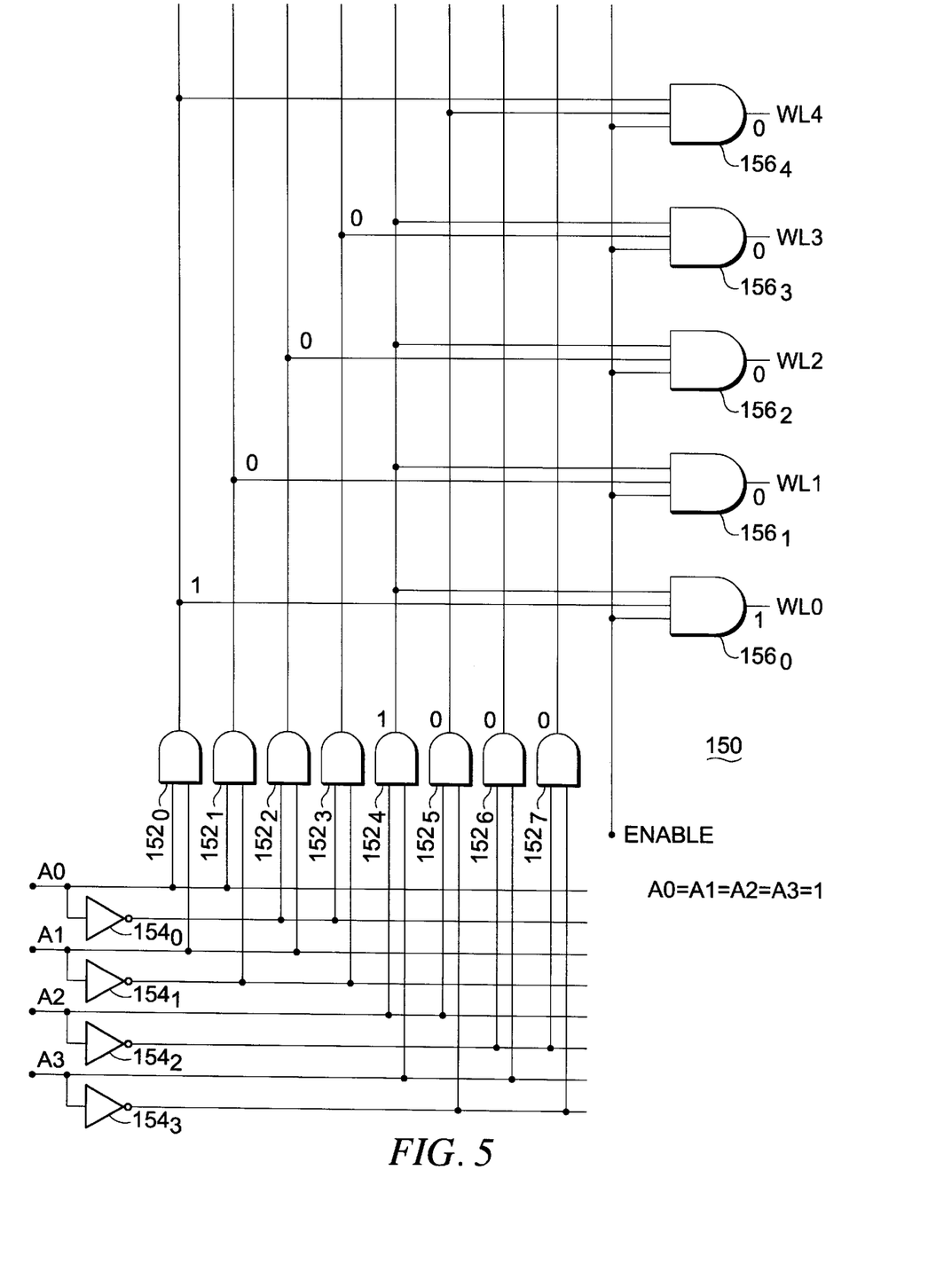
FIG. 5 illustrates a word line activation circuit in which a single word line, for example word line WL0, is activated at a time.

With reference additionally now to FIG. 5, a word line activation circuit 150 is shown. The circuit 150 comprises, in pertinent part, a number of input signals (denominated $A_0$ through $A_3$) and their respective complements (passed through inverters $154_0$ through $154_3$ respectively) which are variously applied to the inputs of two input AND gates $152_0$ through $152_7$. The outputs of AND gates $152_0$ through $152_7$ and in particular, combinations of the outputs of AND gates $152_0$ through $152_3$ together with the outputs of NAND gates $152_4$ or $152_7$ are supplied as inputs to two of the terminals of three input AND gates $156_0$ through $156_4$, the outputs of which, drive word lines WL0 through WL4 respectively, as shown in the preceding FIG. 3. The remaining input to each of the AND gates $156_0$ through $156_4$ is coupled to receive an enable signal as shown. In this figure, A0=A1=A2=A3=1 and only a single word line (in this example word line WL0) is activated at a time when a logic "1" appears at the outputs of AND gates $152_0$ and $152_4$ with a logic "0" appearing at the output of all other of the AND gates ($152_1$–$152_3$ and $152_5$–$152_7$).

Figure 6:
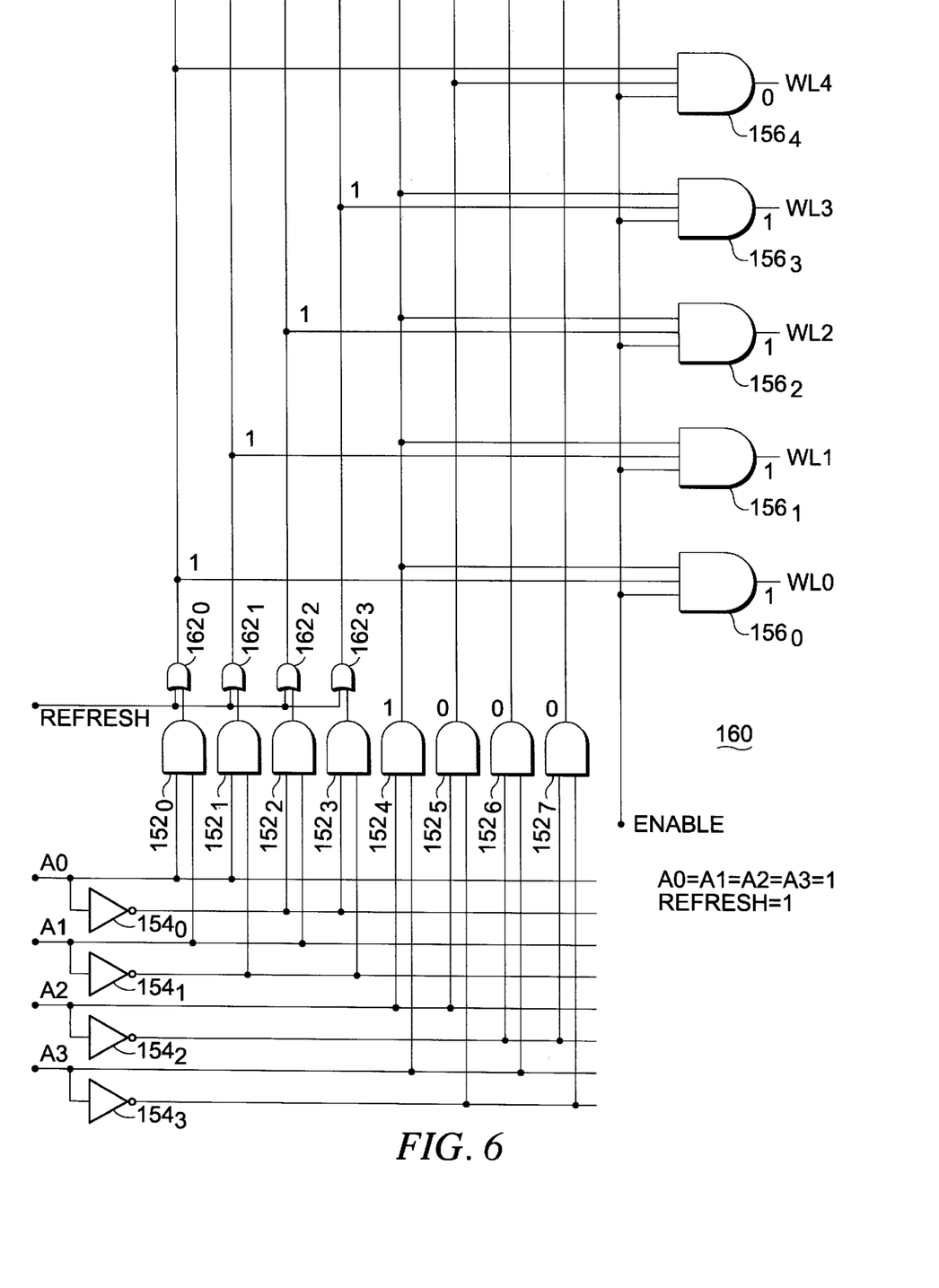
FIG. 6 illustrates a multiple word line activation circuit for use, for example, in conjunction with the embodiment of FIG. 3, to activate multiple word lines (e.g. WL0 through WL3) simultaneously.

With reference additionally now to FIG. 6, a multiple word line activation circuit 160 is shown which may be utilized as the multiple word line activation circuit 126 shown in FIG. 3. In this figure, circuit elements similar to those previously described with respect to that shown in FIG. 5 are like numbered, and the foregoing description thereof shall suffice herefor. The circuit 160 includes an additional number of logic OR gates $162_0$ through $162_3$ coupled between the outputs of AND gates $152_0$ through $152_3$ and the inputs of AND gates $156_0$ through $156_4$ respectively as shown. An additional input of each of the OR gates $162_0$ through $162_3$ is coupled to the refresh signal line as shown. In this example, A0=A1=A2=A3=1 and, when the refresh signal is a logic "1", multiple word lines (in this example, the four word lines WL0 through WL3) may be activated by asserting the refresh signal thereby causing the outputs of the OR gates $162_0$ through $162_3$ to a logic "1" level.

What has been provided, therefore is a multiple transistor dynamic memory cell architecture and refresh technique which allows for cell refresh to occur during a read operation. The access and memory transistors of the individual memory cells are fabricated with a relative width-to-length ratio such that it is sufficient to merely activate the associated word line to perform the refresh operation. This is accomplished without activating the read sense amplifier resulting in lower power consumption and the retention of most recently read data. Moreover, multiple word lines may be activated concurrently utilizing the technique disclosed to further reduce the refresh rate overhead in a memory array and increase the overall memory array bandwidth.

While there have been described above the principles of the present invention in conjunction with a specific memory cell architecture and ratio of memory transistor to access transistor width-to-length ratios, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

What is claimed is:

1. An integrated circuit including a memory array comprising a plurality of memory cells and a sense amplifier coupled between first and second complementary bit lines, each of said memory cells comprising:

first and second memory transistors operable for coupling first and second memory cell nodes to a first voltage line, said first and second memory transistors having a gate terminal thereof coupled to said second and first memory cell nodes respectively;

first and second access transistors operable for coupling said first and second memory cell nodes to said first and second complementary bit lines, said first and second access transistors having a gate terminal thereof coupled to an associated word line;

said first and second memory transistors having a predetermined width-to-length ratio greater than that of said first and second access transistors such that when said associated word line is activated a memory content of said memory cell is refreshed;

circuitry to simultaneously refresh a plurality of said memory cells, without activating said sense amplifier.

2. The integrated circuit of claim 1 further comprising:

first and second precharge transistors operable for coupling said first and second complementary bit lines to a second voltage line, said first and second precharge transistors having a gate terminal thereof coupled to a precharge signal line.

3. The integrated circuit of claim 2 wherein said memory cell is refreshed while said first and second complementary bit lines are coupled to said second voltage line through said first and second precharge transistors.

4. The integrated circuit of claim 1 wherein said predetermined width-to-length ratio of said first and second memory transistors is substantially three times said predetermined width-to-length ratio of said first and second access transistors.

5. The integrated circuit of claim 1 wherein said predetermined width-to-length ratio of said first and second memory transistors is substantially 5.7/0.6 microns.

6. The integrated circuit of claim 1 wherein said predetermined width-to-length ratio of said first and second access transistors is substantially 1.8/0.6 microns.

7. The integrated circuit of claim 1 further comprising:

at least one additional memory cell coupled to said first and second complementary bit lines and an additional associated word line, said at least one additional associated word line being activated substantially concurrently with said associated word line such that said at least one additional memory cell is refreshed substantially concurrently with said memory cell.

8. The integrated circuit of claim 7 wherein said memory cell and said at least one additional memory cells comprise substantially 1/32 of said plurality of memory cells in said memory array.

9. The integrated circuit of claim 1 wherein said first and second memory transistors comprise n-channel devices.

10. The integrated circuit of claim 1 wherein said first and second access transistors comprise n-channel devices.

11. The integrated circuit of claim 1 wherein said first voltage line is substantially circuit ground.

12. The integrated circuit of claim 7 wherein said first and second precharge transistors comprise p-channel devices.

13. The integrated circuit of claim 2 wherein said second voltage line supplies substantially 3.0 volts.

14. A method for refreshing an integrated circuit memory array comprising a plurality of dynamic memory cells, each of said memory cells being arranged in n number of rows thereof coupled to a corresponding n number of word lines and in m number of columns thereof coupled to a corresponding m number of complementary bit line pairs having a sense amplifier also coupled between each of said m number of complementary bit line pairs, said method comprising the step of:

concurrently activating at least two of said n number of word lines to refresh a memory contents of said memory cells coupled thereto without activating said sense amplifier.

15. The method of claim 14 further comprising the step of:

precharging said m number of complementary bit line pairs substantially concurrently with said step of concurrently activating.

16. The method of claim 14 wherein said step of concurrently activating is performed on substantially 1/32 of said n number of word lines.

17. An integrated circuit memory array comprising:

a plurality of dynamic memory cells arranged in n rows coupled to n associated word lines and m columns coupled to m complementary bit line pairs;

a multiple word line activation circuit coupled to a subset of said n associated word lines operative to concurrently enable a plurality of said word lines to refresh ones of said plurality of dynamic memory cells coupled to said subset of said n associated word lines, wherein said memory cells are refreshed without activating sense amplifiers coupled between said m complementary bit line pairs.

18. The integrated circuit memory array of claim 17 wherein each of said plurality of dynamic memory cells comprises:

first and second memory transistors operable for coupling first and second memory cell nodes to a first voltage line, said first and second memory transistors having a gate terminal thereof coupled to said second and first memory cell nodes respectively.

19. The integrated circuit memory array of claim 18 further comprising:

first and second access transistors operable for coupling said first and second memory cell nodes to selected ones of said m complementary bit line pairs, said first and second access transistors having a gate terminal thereof coupled to a selected one of said n associated word lines.

20. The integrated circuit memory array of claim 19 wherein said first and second memory transistors have a predetermined width-to-length ratio greater than that of said first and second access transistors such that when said subset of said n associated word lines is activated a memory contents of said plurality of memory cells coupled thereto is refreshed.

21. The integrated circuit memory array of claim 20 further comprising:

first and second precharge transistors operable for coupling each of said m complementary bit line pairs to a second voltage line, said first and second precharge transistors having a gate terminal thereof coupled to a precharge signal line.

22. The integrated circuit memory array of claim 21 wherein said memory cells are refreshed while said m complementary bit line pairs are coupled to said second voltage line through said first and second precharge transistors.

23. The integrated circuit memory array of claim 20 wherein said predetermined width-to-length ratio of said first and second memory transistors is substantially three times said predetermined width-to-length ratio of said first and second access transistors.

24. The integrated circuit memory array of claim 20 wherein said predetermined width-to-length ratio of said first and second memory transistors is substantially 5.7/0.6 microns.

25. The integrated circuit memory array of claim 20 wherein said predetermined width-to-length ratio of said first and second access transistors is substantially 1.8/0.6 microns.

26. The integrated circuit memory array of claim 20 wherein said first and second memory transistors comprise n-channel devices.

27. The integrated circuit memory array of claim 20 wherein said first and second access transistors comprise n-channel devices.

28. The integrated circuit memory array of claim 20 wherein said first voltage line is substantially circuit ground.

29. The integrated circuit memory array of claim 21 wherein said first and second precharge transistors comprise p-channel devices.

30. The integrated circuit memory array of claim 21 wherein said second voltage line supplies substantially 3.0 volts.

* * * * *